(12) United States Patent
Krutz et al.

(10) Patent No.: US 10,843,441 B2
(45) Date of Patent: Nov. 24, 2020

(54) ELECTROACTIVE POLYMERS, METHODS OF MANUFACTURE, AND STRUCTURES FORMED THEREOF

(71) Applicant: Purdue Research Foundation, West Lafayette, IN (US)

(72) Inventors: Gary W. Krutz, West Lafayette, IN (US); Brittany Newell, Delphi, IN (US)

(73) Assignee: Purdue Research Foundation, West Lafayette, IN (US)

( * ) Notice: Subject to any disclaimer, the term of this patent is extended or adjusted under 35 U.S.C. 154(b) by 234 days.

(21) Appl. No.: 15/556,696

(22) PCT Filed: Mar. 10, 2016

(86) PCT No.: PCT/US2016/021778
§ 371 (c)(1),
(2) Date: Sep. 8, 2017

(87) PCT Pub. No.: WO2016/149035
PCT Pub. Date: Sep. 22, 2016

(65) Prior Publication Data
US 2018/0104936 A1    Apr. 19, 2018

Related U.S. Application Data

(60) Provisional application No. 62/132,556, filed on Mar. 13, 2015.

(51) Int. Cl.
*B32B 25/08* (2006.01)
*B32B 37/14* (2006.01)
(Continued)

(52) U.S. Cl.
CPC .............. *B32B 25/08* (2013.01); *B32B 25/20* (2013.01); *B32B 27/08* (2013.01); *B32B 27/16* (2013.01);
(Continued)

(58) Field of Classification Search
CPC ..... B32B 25/08; B32B 25/285; H01L 41/047; H01L 41/0478
(Continued)

(56) References Cited

U.S. PATENT DOCUMENTS 3,951,882 A * 4/1976 Markhart ............... H01B 3/006
                                                        524/447
6,543,110 B1    4/2003 Pelrine et al.
(Continued)

FOREIGN PATENT DOCUMENTS

| WO | 2011-097020 | 8/2011 | |
|---|---|---|---|
| WO | 2013-112849 | 8/2013 | |
| WO | WO-2013112849 A1 * | 8/2013 | ............. F16J 15/008 |

OTHER PUBLICATIONS

International Search Report dated Jul. 25, 2016 for PCT/US16/021778.

*Primary Examiner* — Betelhem Shewareged
(74) *Attorney, Agent, or Firm* — Hartman Global IP Law; Gary M. Hartman; Domenica N. S. Hartman

(57) ABSTRACT

Methods for producing layered structures that include a conductive polymeric layer and a dielectric polymeric layer. The dielectric polymeric layer can be formed by curing a first volume of a dielectric polymeric material. A second volume of the dielectric polymeric material is doped with conductive particulates to yield a conductive polymeric material, which is then partially cured and solvated to create a conductive polymeric paste. The paste is applied to a surface of the dielectric polymeric layer, dried, and cured to form a conductive polymeric layer on the pre-strained dielectric polymeric layer yielding a layered structure that includes the conductive polymeric layer and the dielectric polymeric layer. A pre-strain is induced in the dielectric polymeric material by contacting a chemical thereto that causes swelling therein.

8 Claims, 1 Drawing Sheet

(51) Int. Cl.
<table>
<tr><td>B32B 38/00</td><td>(2006.01)</td></tr>
<tr><td>B32B 25/20</td><td>(2006.01)</td></tr>
<tr><td>B32B 27/16</td><td>(2006.01)</td></tr>
<tr><td>B32B 27/26</td><td>(2006.01)</td></tr>
<tr><td>B32B 27/28</td><td>(2006.01)</td></tr>
<tr><td>B32B 27/30</td><td>(2006.01)</td></tr>
<tr><td>B32B 27/32</td><td>(2006.01)</td></tr>
<tr><td>H01L 41/047</td><td>(2006.01)</td></tr>
<tr><td>H01L 41/09</td><td>(2006.01)</td></tr>
<tr><td>B32B 27/08</td><td>(2006.01)</td></tr>
<tr><td>H01L 41/29</td><td>(2013.01)</td></tr>
<tr><td>H01L 41/193</td><td>(2006.01)</td></tr>
<tr><td>H01B 5/14</td><td>(2006.01)</td></tr>
</table>

(52) U.S. Cl.
CPC ............ *B32B 27/26* (2013.01); *B32B 27/285* (2013.01); *B32B 27/288* (2013.01); *B32B 27/304* (2013.01); *B32B 27/322* (2013.01); *B32B 37/144* (2013.01); *B32B 38/164* (2013.01); *H01B 5/14* (2013.01); *H01L 41/0478* (2013.01); *H01L 41/0986* (2013.01); *H01L 41/193* (2013.01); *H01L 41/29* (2013.01); *B32B 2264/00* (2013.01); *B32B 2307/202* (2013.01); *B32B 2307/204* (2013.01); *B32B 2457/00* (2013.01); *H01L 41/047* (2013.01)

(58) Field of Classification Search
USPC ....................................................... 428/195.1
See application file for complete search history.

(56) References Cited

U.S. PATENT DOCUMENTS

<table>
<tr><td>2013/0236730 A1</td><td></td><td>9/2013</td><td>Bose et al.</td></tr>
<tr><td>2014/0202745 A1</td><td></td><td>7/2014</td><td>Kobayashi et al.</td></tr>
<tr><td>2015/0091254 A1</td><td>*</td><td>4/2015</td><td>Krutz .................... F16J 15/008<br>277/312</td></tr>
</table>

* cited by examiner

ELECTROACTIVE POLYMERS, METHODS OF MANUFACTURE, AND STRUCTURES FORMED THEREOF

CROSS REFERENCE TO RELATED APPLICATIONS

This application claims priority to International Patent Application No. PCT/US16/21778, filed Mar. 10, 2016, which claims the benefit of U.S. Provisional Application No. 62/132,556, filed Mar. 13, 2015, the contents of which are incorporated herein by reference.

BACKGROUND OF THE INVENTION

The present invention generally relates to polymeric structures. The invention particularly relates to methods for producing polymer materials having electroactive properties and structures formed thereof.

A group of polymeric materials known as electroactive polymers (EAP) have been considered for various applications due to their ability to convert electrical energy into mechanical motion through a process of deformation. Notable examples include actuators in which motion can be induced by the application of electrical energy to an EAP material. EAPs can be divided into two subcategories, ionic and electric EAPs. Dielectric EAP materials are a subclass of electric EAPs that are viscoelastic and exhibit properties similar to dielectric materials of capacitors when positioned between two conductive electrodes. When a sufficient electrical potential is applied to the electrodes, Coulomb forces cause electrostatic stresses to occur that cause the viscoelastic EAP material to reallocate its volume, forcing it to constrict in thickness and expand (strain) in the in-plane (length and width) directions. This deformation brings the oppositely charged electrodes into closer proximity relative to one another. When the electromagnetic field is removed, the EAP material substantially returns to its original state.

Electroactive polymer materials, particularly dielectric elastomers, exhibit improved performance in the form of increased deformation when exposed to an electric field if the materials are pre-strained prior to implementation of an electric field. In most applications, pre-strain is applied using a mechanical stretcher and the polymer is retained on the stretcher.

U.S. Patent Application Publication No. 2015/0091254 discloses actuators and methods utilizing electrical properties of polymer materials, including but not limited to sealing systems, elements and methods. Such actuators may comprise a multilayer structure that includes electrodes formed of electrically-conductive polymer materials, and an electroactive polymer layer therebetween formed of a dielectric elastomer. The electroactive polymer layer is bonded to the electrodes so as to have a thickness dimension therebetween, and an electric potential applied to the electrodes causes the electroactive polymer layer to expand.

U.S. Patent Application Publication No. 2015/0091254 also discloses methods of fabricating such actuators by inducing a strain memory state in the electroactive polymer material using a pre-straining technique that expands the electroactive polymer material and then releases the electroactive polymer material to allow the electroactive polymer material to substantially shrink to its pre-strained dimensions. In contrast to the aforementioned mechanical pre-straining methods, a particular example is a chemical pre-straining technique that is believed to be particularly suitable for certain EAP materials, including a fluorocarbon-based FKM EAP material.

There is an ongoing desire for improved methods of producing EAP materials and actuators formed therefrom.

BRIEF DESCRIPTION OF THE INVENTION

The present invention provides methods for pre-straining polymer materials having electroactive properties, and producing layered structures from such materials, a nonlimiting example of which includes actuators.

According to one aspect of the invention, a method includes providing a cured dielectric polymeric layer formed of a first volume of a dielectric polymeric material, doping a second volume of the dielectric polymeric material with conductive particulates to yield a conductive polymeric material, partially curing the conductive polymeric material, solvating the conductive polymeric material to create a conductive polymeric paste, applying the conductive polymeric paste to a surface of the dielectric polymeric layer wherein the conductive polymeric paste includes a chemical that causes the dielectric polymeric layer to swell, drying the conductive polymeric paste to form a conductive polymeric layer on the dielectric polymeric layer, allow the dielectric polymeric material to shrink, induce a pre-strain in the dielectric polymeric layer, and yield a layered structure comprising the conductive polymeric layer and the dielectric polymeric layer, and then curing the conductive polymeric layer to bond the conductive polymeric layer to the dielectric polymeric layer.

According to another aspect of the invention, a method includes chemically pre-straining a cured dielectric polymeric layer formed of a first volume of a dielectric polymeric material by contacting the dielectric polymeric layer with a chemical that causes the dielectric polymeric layer to swell, and then removing the dielectric polymeric layer from contact with the chemical to allow the dielectric polymeric layer to shrink, induce a pre-strain in the dielectric polymeric layer, and yield a pre-strained dielectric polymeric layer. The method further includes doping a second volume of the dielectric polymeric material with conductive particulates to yield a conductive polymeric material, partially curing the conductive polymeric material, solvating the conductive polymeric material to create a conductive polymeric paste, applying the conductive polymeric paste to a surface of the pre-strained dielectric polymeric layer, drying the conductive polymeric paste to form a conductive polymeric layer on the pre-strained dielectric polymeric layer and yield a layered structure comprising the conductive polymeric layer and the pre-strained dielectric polymeric layer, and then curing the conductive polymeric layer to bond the conductive polymeric layer to the dielectric polymeric layer.

Technical effects of the methods described above preferably include the ability to provide, manufacture, and use electroactive polymer actuators entirely composed of polymer-based materials for their conductive and dielectric components. The use of the same polymeric base material for the dielectric and conductive components allows for the dielectric and conductive components to be cross-linked together, ensuring better electrical contact therebetween. In addition, use of the same polymer base material reduces inhibition of deformation by the conductive components.

Other aspects and advantages of this invention will be better appreciated from the following detailed description.

DETAILED DESCRIPTION OF THE INVENTION

The present invention provides methods for pre-straining polymer materials having electroactive properties, and producing layered structures from such materials. In particular, the methods may be used to manufacture actuators whose movement is controlled by the application of an electrical field to an electroactive polymers (EAP) material. Conversely, it is possible to generate an electrical field with an actuator containing an EAP material by physically actuating the actuator. One aspect of the invention is a construction of an actuator using only EAP materials.

Preferred EAP materials for use with the present invention include, but are not limited to, dielectric elastomers whose strain is nominally proportional to the square of the activating electric field. Various dielectric elastomers are known and can be used with the present invention, nonlimiting examples of which include VHB 4905 and 4910 acrylic-based materials commercially available from 3M. Other notable EAP materials include fluoropolymers, particularly FKM (hexafluoropropylene vinylidene fluoride copolymer), commercial sources of which include Parker Seals, Inc.

Figure 1:
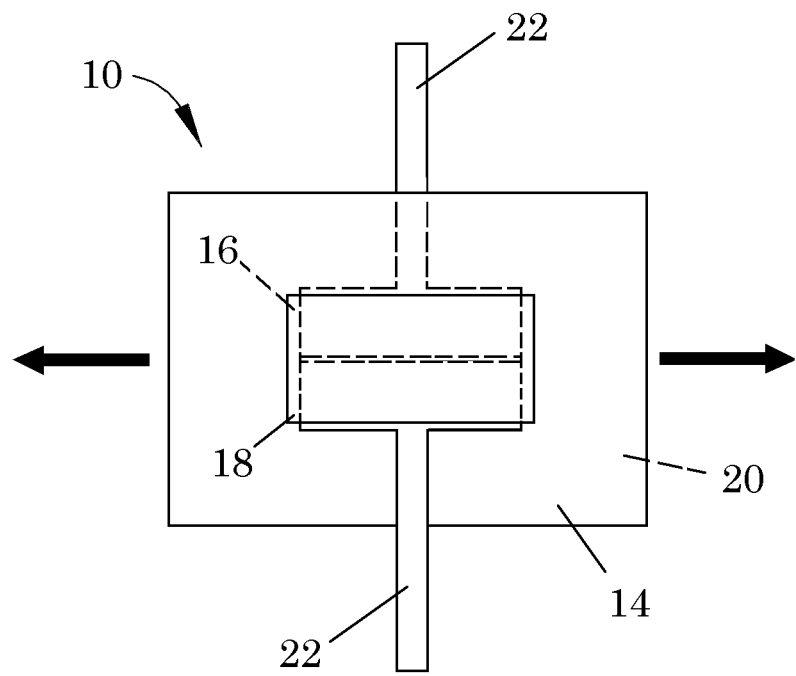
FIGS. 1 and 2 are plan and cross-sectional views, respectively, that schematically represent a planar multilayer configuration suitable for use as an actuator in accordance with certain embodiments of the present invention.
Figure 2:
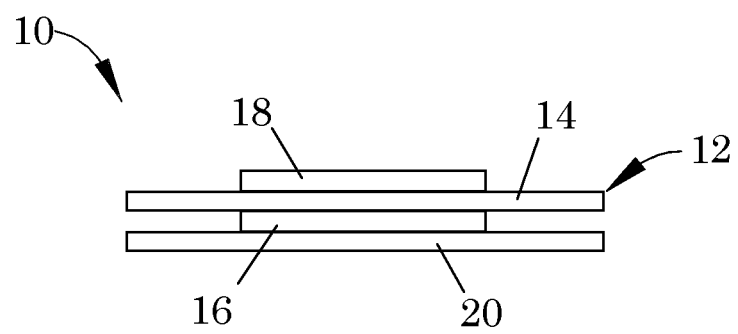

FIGS. 1 and 2 schematically represent a nonlimiting actuator 10 configured in accordance with a nonlimiting embodiment of the invention. As represented in FIGS. 1 and 2, the actuator 10 has a layered (multilayer) structure 12 comprising a layer 14 of an EAP material disposed between a pair of electrodes 16 and 18. An optional fourth layer 20 is represented in FIGS. 1 and 2 that, if present, is preferably also formed of an EAP material. In the configuration represented in FIGS. 1 and 2, the EAP material layer 14 between the electrodes 16 and 18 is referred to as an active layer because it is subjected to an electrical field applied as a result of an electrical potential being applied across the electrodes 16 and 18. When an electromagnetic field is applied through the electrodes 16 and 18, the EAP material of the layer 14 reallocates its volume, compressing in the thickness direction and expanding on the plane transverse to the thickness direction. The fourth layer 20 can be considered to be an inactive layer of the actuator 10, and its primary role is to prevent shorting between the electrode 16 and surrounding components of a system in which the actuator 10 is installed. Alternatively, the fourth layer 20 may also be an active layer and the circuit may be repeated, that is, multiple actuators 10 may be stacked in order to increase the force and actuation potential. The layers 14, 16, 18 and 20 contact and are bonded to each other so that the layers 14, 16, 18 and 20 expand and contract largely in unison, primarily in the plane parallel to the layers 14, 16, 18 and 20. For this purpose, adhesives or compression molding techniques may be used, though in preferred embodiments the electrodes 16 and 18 are applied to the EAP layer 14 by roll to roll processes, additive manufacturing, or screen printing processes and the layers 14, 16, 18 and 20 are bonded together by co-curing. Various co-curing techniques are foreseeable and within the scope of the invention. In the embodiment represented in FIGS. 1 and 2, the electrodes 16 and 18 are contacted by metal leads 22 through which the electrical potential can be applied to the electrodes 16 and 18. A wide variety of flexible and substantially rigid conductive materials can be used to form the leads 22.

As in U.S. Patent Application Publication No. 2015/0091254, methods for producing the multilayer structure 12 utilize a chemical pre-straining technique to produce the EAP layer 14 that does not require the strain to be retained in its EAP material. Such a chemical treatment process generally entails contacting a sheet or film of a cured EAP material with a chemical that causes the cured EAP material to swell. The treatment is carried out until the EAP material has sufficiently swelled, as a nonlimiting example, as evidenced by a linear dimensional increase of about 100 percent or more. Thereafter, the EAP material is removed from contact with the chemical and allowed to dry, resulting in the EAP material substantially shrinking back to its original dimensions, for example, within about 5% of its original dimensions.

In a particular but nonlimiting example, the EAP material can be a fluoropolymer (FKM), and the chemical pre-straining technique uses a methyl ethyl ketone (MEK), which is known to cause cured FKM to swell due to an amine reaction. This reaction causes intercalation of the solutes into the polymer matrix of FKM. In one investigation, a volume of FKM was cured to form a layer of cured FKM that was then placed in MEK for about five minutes, resulting in the FKM at least doubling in volume. If the FKM was not cured prior to contact with MEK, the MEK would dissolve the FKM. The FKM was then allowed to dry for at least twelve hours, which allowed the FKM to return to roughly its original size. The swelling reaction was determined to be greater than 95% reversible. Furthermore, the MEK caused the volume of FKM to swell evenly in all directions, allowing for more uniform strain when compared to mechanical stretching.

While not wishing to be held to any particular theory, with this process the EAP layer 14 and, optionally, the EAP layer 20 appeared to retain a strain memory, allowing for the electrodes 16 and 18 to be attached thereto while the layers 14 and 20 are not in the process of being pre-strained or are in a physically pre-strained condition. Instead, the electrodes 16 and 18 can be attached to the EAP layers 14 and 20 after pre-strain has been released (i.e., their EAP materials are no longer swelled). Such a technique is in contrast to prior practices that entail intentionally retaining a pre-strain in an EAP material during application of the electrodes, for example, with a stiffened region surrounding a pre-strained region of an EAP material to continuously apply a strain to the pre-strained region while the electrodes are being attached. Consequently, the present invention encompasses a method of fabricating an actuator that entails pre-straining an EAP material, and then releasing the strain to induce a strain memory in the EAP material prior to application of electrodes thereto, and until such a time as the resulting actuator (10) is activated by the application of an electric field with the electrodes (16 and 18). Though investigations leading to the invention induced strain memory in an EAP material through a chemical treatment that caused the material to swell, it is foreseeable that strain memory could be induced in a variety of EAP materials through the use of other pre-straining techniques that expand the EAP material and then release the EAP material to allow the material to shrink and return or nearly return to its pre-strained dimensions. Suitable techniques for pre-straining the EAP layers 14 and 20 include mechanical, electrical, radiation, and thermal techniques of types known in the art. For example, pre-straining of the EAP layers 14 and 20 can be mechanically induced with the use of unidirectional, bidirectional, and omnidirectional stretching equipment.

Unlike U.S. Patent Application Publication No. 2015/0091254, which used electrically-conductive polymer materials that exhibit flexibility comparable to the EAP layer 14, such as mixtures of conductive grease mixed with graphite, silver inks or paints, mixtures of silicone and graphite, and electrically-conductive silicone-based rubber materials, preferred embodiments of the present invention form the electrodes 16 and 18 from the same EAP material used for manufacturing the EAP layer 14. In accordance with a nonlimiting embodiment of the invention, one or both of the electrodes 16 and 18 may be produced by doping a volume of a dielectric polymeric material having the same composition as that of the EAP layer 14 with conductive particulates to yield a conductive polymer material having the same base polymeric composition as that of the EAP layer 14. The conductive polymer material is partially cured, which enables the material to be at least partially solvated to create a conductive polymeric paste or paint. This paste may be applied to opposite sides of the cured EAP layer 14 (in which case the layer 14 serves as a substrate) and then dried to form the layers 16 and 18 on the pre-strained EAP layer 14. Application of the paste to the EAP layer 14 may induce additional pre-strain in the EAP layer 14. If layer 20 is desired, it may be attached at this point. Preferably, the layers 16 and 18 are then bonded to the layers 14 and 20 by curing the layers 16 and 18.

For example, the aforementioned investigations further involved the application of a conductive layer to a pre-strained dielectric FKM layer formed as described above. In this process, a second volume of FKM was doped with conductive particulates and partially cured. The partially-cured, doped FKM material was then solvated using MEK, creating a paste which was then painted onto a surface area of the pre-strained dielectric FKM layer. The paste was then allowed to dry to form a conductive layer of the partially-cured, doped FKM material. The MEK in the conductive layer caused additional pre-strain in the pre-strained dielectric FKM layer, thereby improving deformation potential. The resulting layered structure was then cured at about 425° F. The use of the same polymeric base material for the dielectric and conductive layers of the layered structure allowed for a more durable design because all layers (dielectric and conductive) were cross-linked together, ensuring better electrical contact between the dielectric and conductive layers. In addition, use of the same polymeric base material drastically reduced inhibition of deformation by the conductive layer.

In the above processes, the cured EAP layer 14 is pre-strained by the chemical straining process prior to application of the conductive polymeric paste thereto, which may cause additional pre-straining in the EAP layer 14. As an alternative, the conductive polymeric paste may be applied to the cured EAP layer 14 prior to any pre-straining of the EAP layer 14, and a chemical in the conductive polymeric paste (for example, MEK) may be utilized to cause swelling of the EAP layer 14 and create pre-straining therein. In yet another alternative method, conductive polymeric layers and dielectric polymeric layers may be contacted and co-cured to form the layers 14, 16, and 18 (optionally layer 20), and then the stack may be contacted with a chemical to cause swelling and pre-strain in the EAP layer 14.

In view of the above, electroactive polymer actuators can be fabricated whose conductive and dielectric components are entirely composed of polymer-based materials, and preferably the very same polymeric base materials. Actuators can be fabricated by curing a layered structure comprising solvated conductive layers applied to opposite surfaces of a pre-strained dielectric layer as described above. Such a chemical pre-strain and electrode application method can be used for many materials other than FKM. As non-limiting examples, ethylene propylene rubber (EPDM) and silicone swell in petroleum oil and fuel, nitriles (for example, nitrile rubber (NBR)) swell in toluene, and VHB acrylics (3M) swell in solvents, and therefore are candidates for the chemical pre-straining technique described above. Preferred polymeric materials for a given application will depend on desired material properties of a layered structure.

Applications for layered structures as described above include, but are not limited to, seals having the ability to reseal a leak, and actuators for use in such varied applications as automotive systems (for example, to alert drivers to hazards) and medical applications (for example, to promote circulation, control urinary incontinence, pumps, etc.).

While the invention has been described in terms of specific embodiments, it is apparent that other forms could be adopted by one skilled in the art. For example, the physical configuration of the actuator 10 could differ from that shown, and materials and processes/methods other than those noted could be used. Therefore, the scope of the invention is to be limited only by the following claims.

The invention claimed is:
1. An actuator produced by a method comprising:
providing a cured dielectric polymeric layer formed of a first volume of a dielectric polymeric material;
doping a second volume of the dielectric polymeric material with conductive particulates to yield a conductive polymeric material;
partially curing the conductive polymeric material to yield a partially-cured conductive polymeric material;
combining the partially-cured conductive polymeric material with a chemical to at least partially solvate the partially-cured conductive polymeric material to create a conductive polymeric paste;
applying the conductive polymeric paste to a surface of the cured dielectric polymeric layer and intercalating the chemical into the cured dielectric polymeric material to cause the cured dielectric polymeric layer to swell and induce a pre-strain in the cured dielectric polymeric layer;
drying the conductive polymeric paste to form a partially-cured conductive polymeric layer on the cured dielectric polymeric layer, allow the dielectric polymeric material to shrink, and yield a layered structure comprising the partially-cured conductive polymeric layer and the cured dielectric polymeric layer; and then
co-curing the partially-cured conductive polymeric layer and the cured dielectric polymeric layer to form a cured conductive polymeric layer that is cross-linked to the cured dielectric polymeric layer such that the cured conductive polymeric layer and the cured dielectric polymeric layer are cross-linked together;
wherein the cured conductive polymeric layer is a first cured conductive polymeric layer and the actuator comprises the layered structure and a second cured conductive polymeric layer formed on the cured dielectric polymeric layer.

2. The actuator according to claim 1, wherein the dielectric polymeric material is a fluoropolymer, and the chemical is methyl ethyl ketone.

3. The actuator according to claim 1, wherein the dielectric polymeric material is an ethylene propylene rubber or a silicone-based material, and the chemical is a petroleum-based oil or fuel.

4. The actuator according to claim 1, wherein the dielectric polymeric material is a nitrile material, and the chemical is toluene.

5. An actuator produced by a method comprising:
chemically pre-straining a cured dielectric polymeric layer formed of a first volume of a dielectric polymeric material by contacting the cured dielectric polymeric layer with a chemical that is intercalated into the dielectric polymeric material and causes the cured dielectric polymeric layer to swell, and then removing the cured dielectric polymeric layer from contact with the chemical to allow the cured dielectric polymeric layer to shrink, induce a pre-strain in the cured dielectric polymeric layer, and yield a pre-strained cured dielectric polymeric layer;
doping a second volume of the dielectric polymeric material with conductive particulates to yield a conductive polymeric material;
partially curing the conductive polymeric material to yield a partially-cured conductive polymeric material;
combining the partially-cured conductive polymeric material with a chemical to at least partially solvate the partially-cured conductive polymeric material to create a conductive polymeric paste;
applying the conductive polymeric paste to a surface of the pre-strained cured dielectric polymeric layer;
drying the conductive polymeric paste to form a partially-cured conductive polymeric layer on the pre-strained cured dielectric polymeric layer, and yield a layered structure comprising the partially-cured conductive polymeric layer and the pre-strained cured dielectric polymeric layer; and then
co-curing the partially-cured conductive polymeric layer and the cured dielectric polymeric layer to form a cured conductive polymeric layer that is cross-linked to the pre-strained cured dielectric polymeric layer such that the cured conductive polymeric layer and the cured dielectric polymeric layer are cross-linked together;
wherein the cured conductive polymeric layer is a first cured conductive polymeric layer and the actuator comprises the layered structure and a second cured conductive polymeric layer formed on the pre-strained cured dielectric polymeric layer.

6. The actuator according to claim 5, wherein the dielectric polymeric material is a fluoropolymer, and the chemical is methyl ethyl ketone.

7. The actuator according to claim 5, wherein the dielectric polymeric material is an ethylene propylene rubber or a silicone-based material, and the chemical is a petroleum-based oil or fuel.

8. The actuator according to claim 5, wherein the dielectric polymeric material is a nitrile material, and the chemical is toluene.

* * * * *